United States Patent [19]
Li

[11] Patent Number: 5,932,348
[45] Date of Patent: Aug. 3, 1999

[54] COMPOSITE WITH NON-SEGREGATING REINFORCING ELEMENTS

[76] Inventor: Chou H. Li, 8001 Sailboat Key Blvd. #404, South Pasadena, Fla. 33707

[21] Appl. No.: 08/805,535

[22] Filed: Feb. 25, 1997

[51] Int. Cl.$^6$ .............................. B23K 1/19; B23K 31/02
[52] U.S. Cl. ..................... 428/402; 428/373; 428/374; 428/357; 428/397; 228/121; 228/122.1; 228/124.5; 228/126; 427/229; 427/376.7; 427/383.5; 427/376.6
[58] Field of Search ...................... 428/373, 374, 428/357, 397, 402; 228/124.5, 121, 263.12, 126, 122.1; 427/229, 376.7, 383.5, 376.6

[56] References Cited

U.S. PATENT DOCUMENTS

| | | |
|---|---|---|
| 4,890,783 | 1/1990 | Li. |
| 5,230,924 | 7/1993 | Li ............................................. 427/229 |
| 5,248,079 | 9/1993 | Li. |
| 5,392,982 | 2/1995 | Li. |

OTHER PUBLICATIONS

U.S. application No. 08/482,199, Li, filed Jun. 8, 1995.
U.S. application No. 08/301,582, Li, filed Sep. 7, 1994.
U.S. application No. 08/947,308, Li, filed Oct. 8, 1997.

*Primary Examiner*—Richard Weisberger
*Attorney, Agent, or Firm*—Nikaido, Marmelstein, Murray & Oram, LLP

[57] ABSTRACT

A method of making an improved composite containing substantially non-segregating solid reinforcing elements therein is disclosed. New composites and non-segregating solid reinforcing elements for these composites are also disclosed.

58 Claims, 3 Drawing Sheets

COMPOSITE WITH NON-SEGREGATING REINFORCING ELEMENTS

FIELD OF THE INVENTION

This invention relates, generally, to methods of making an improved composite and improved composites derived from those methods. Specifically, the present invention relates to methods of making an improved composite containing non-segregating solid reinforcing elements therein. Novel non-segregating solid reinforcing elements are also disclosed.

BACKGROUND OF THE INVENTION

Composites are important structural materials. Oftentimes composites are reinforced by suspending or embedding solid strengthening or reinforcing elements, such as, reinforcing powders, rods, sheets, weaves, or combinations thereof within the composite matrix. Generally, the solid reinforcing elements are rigid and temperature resistant and are thus used to make the entire composite matrix more rigid and temperature resistant. Many other benefits are achieved by reinforcing composites. For example, reinforced composites can be prepared which resist creep, fatigue, and tensile or shear fractures at temperatures which are close to the melting point of the composite matrix.

Reinforced composites are formed by adding solid strengthening or reinforcing elements to a liquid composite matrix followed by mixing, in an attempt to achieve a homogeneous mixture, and finally solidifying or freezing the mixture to provide a reinforced composite matrix which contains the solid strengthening or reinforcing elements embedded therein. Ideally, the solid reinforcing elements are uniformly distributed in the composite matrix to realize and optimize the desired performance of the reinforced composite matrix. However, it is extremely difficult, if not impossible, to achieve uniform distribution of reinforcing elements in a composite matrix.

The uniform distribution of the solid reinforcing elements in a liquid or solid composite matrix is a critical factor in achieving optimum composite performance. If the solid reinforcing elements are heavier than the composite matrix, they gravitationally segregate at the bottom of the liquid composite matrix during the solidification process. This segregation causes a non-uniform distribution of reinforcing elements in the composite matrix. Specifically, the solid reinforcing elements are overcrowded at the bottom of the composite matrix if the reinforcing elements are heavier, or have higher densities, than the composite matrix. This overcrowding reduces the efficacy of these solid reinforcing elements and decreases the usefulness of the resulting reinforced composite.

Reinforcing element segregation at corners, edges, and deep but narrow walls is also very common. Overcrowded reinforcing elements at certain segregated places, such as the bottom for heavier solid reinforcing elements or the top for lighter solid reinforcing elements, causes weakness in the composite matrix. In particular, if a composite matrix has too many solid reinforcing elements, it may be even weaker than a composite matrix without any reinforcement. This weakness results because the solid reinforcing elements are not sufficiently supported by, or connected to, the composite matrix which causes localized overstresses, which in turn initiate voids and cracks in the matrix. Similarly, in areas of the composite matrix where solid reinforcing elements are underpopulated, the composite matrix is, of course, weak and not properly reinforced.

Proper reinforcement is also problematic in cases where a composite is narrow and deep, such as between two concentric cylinders. In this case the composite thickness between the inner and outer cylindrical walls may be one inch to several inches long and the radius or thickness of the solid reinforcing elements may be 10 microns to 3 mils. Given these parameters, the gravitational segregation of solid reinforcing elements at localized spots may initiate premature composite failure.

An inferior composite results because of the differing densities of the liquid composite matrix and the solid reinforcing elements. In particular, solid reinforcing elements sink when suspended in a lighter liquid composite matrix. On the other hand, lighter reinforcing elements float when suspended in a heavier liquid composite matrix. In either case, the solid reinforcing elements segregate due to gravity, resulting in a non-uniform distribution of the solid reinforcing elements in the liquid composite matrix. Further, this non-uniform distribution pattern is carried over during the composite matrix solidification, e.g., freezing or resin polymerization of the composite matrix, resulting in undesirable segregation patterns of the solid reinforcing elements in the resultant solid composite matrix.

Figure 1:
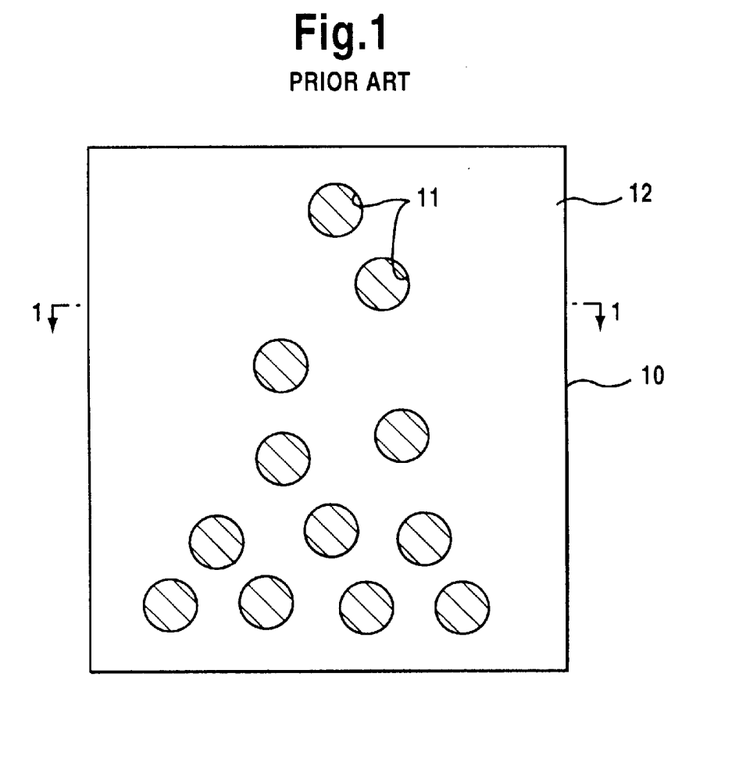
FIG. 1 is a cross-sectional view, taken along lines 1—1 thereof, of a prior-art reinforced composite.

This non-uniform distribution of reinforcing elements which is detrimental to the performance of a reinforced composite is shown in FIG. 1, which is a cross-sectional view of a prior-art reinforced composite, taken along lines 1—1 thereof, and is denoted as a whole by reference numeral 10. As shown in FIG. 1, the prior art reinforcing elements 11 have a non-uniform distribution in the composite matrix 12.

Different approaches, having varying degrees of success have attempted to overcome the deficiencies in the prior art reinforced composites. Specifically, a tedious and time-consuming process of hand packing reinforcing elements into a composite matrix has attempted to achieve the desired reinforcing element uniform distribution. In particular, alternate sheets of composite matrix of a first thickness and solid reinforcing sheets or two-dimensional weaves of a second thickness may, for example, be hand-packed together, layer after layer, followed by liquid infiltration and freezing, pressing or thermal polymerization to form a resultant reinforced composite matrix. This process has several shortcomings, including non-uniform distribution of the reinforcing elements caused by shifting or settling of the packed material, irreproducibility of results and excessive expense in forming the reinforced composite.

Another approach which has attempted to provide uniform distribution of reinforcing elements uses a process which suspends the solid reinforcing elements in a liquid or molten composite matrix. This suspension is then injected into and solidified in a mold causing the solid reinforcing elements to be frozen in place. However, if the reinforcing elements are non-uniformly distributed in the liquid composite matrix prior to solidification in the mold, the final distribution of these elements in the solid composite is also non-uniform. Consequently, an inferior composite having non-uniform reinforcing element distribution results from this process, as shown in the prior-art composite of FIG. 1.

Thus, what is needed then are methods of making reinforced composites in which the solid reinforcing elements are uniformly distributed in a composite matrix resulting in a composite matrix wherein the concentration of the solid reinforcing elements in each unit of volume, e.g., cubic millimeter, of the solidified composite matrix is constant throughout the entire composite.

In view of the prior art as a whole at the time the present invention was made, it was not obvious to those of ordinary skill in the pertinent art how the needed methods of reinforced composite formation could be provided.

SUMMARY OF THE INVENTION

The long-standing but heretofore unfulfilled need for a method of making an improved composite is now met by a method of composite formation which includes mixing a liquid composite matrix having a preselected liquid density with a plurality of solid reinforcing elements to provide a mixture of the liquid composite matrix and the solid reinforcing elements. The reinforcing elements useful in the present invention have an inner core material and an outer shell material. Specifically the inner core material has a preselected average radius or half-thickness $r_1$, a preselected average volume $v_1$, a preselected average density $d_1$, and a preselected average weight $w_1$, while the outer shell material has a preselected average radius or half-thickness $r_2$, a preselected average volume $v_2$, a preselected average density $d_2$, and a preselected average weight $w_2$, wherein each of the reinforcing elements has an average solid density substantially equal to the preselected liquid density of the liquid composite matrix. The mixture is solidified or frozen which provides a composite matrix, i.e., $w_1+w_2=(v_1+v_2)d_m$ having substantially uniform distribution of the solid reinforcing elements in the composite matrix.

Improved composites according to the present invention are also provided. In particular, the composite has a liquid composite matrix which has a preselected liquid density and contains a plurality of solid reinforcing elements. The reinforcing elements have an average solid density substantially equal to the preselected liquid density of the liquid composite matrix providing a composite matrix with a substantially uniform distribution of the solid reinforcing elements therein. The reinforcing elements have an inner core material and an outer shell material. The inner core material has a preselected average radius $r_1$, a preselected average volume $v_1$, a preselected average density $d_1$, and a preselected average weight $w_1$, while the outer shell material has a preselected average radius $r_2$, a preselected average volume $v_2$, a preselected average density $d_2$, and a preselected average weight $w_2$.

According to the present invention solid reinforcing elements are also disclosed. The solid reinforcing elements have an inner core material and an outer shell material. Specifically, the inner core material has a preselected average radius $r_1$, a preselected average volume $v_1$, a preselected average density $d_1$, and a preselected average weight $w_1$, while the outer shell material has a preselected average radius $r_2$, a preselected average volume $v_2$, a preselected average density $d_2$, and a preselected average weight $w_2$. The resulting reinforcing elements have an average solid density substantially equal to a preselected liquid density of a liquid composite matrix and are capable of achieving substantially uniform distribution in the liquid composite matrix during composite matrix formation.

For purposes of the present invention, a composite is any material that results when two or more materials, each having its own, usually different characteristics, are combined, giving useful properties for specific applications. Further, when used in the present specification, a matrix is a material in which something is enclosed or embedded. For purposes of the present invention uniform distribution of solid reinforcing elements in a composite matrix means that the concentration of the solid reinforcing elements in each unit of volume, e.g., cubic millimeter, of the solidified composite matrix is constant throughout the entire composite. In addition, a composite has a matrix component, the matrix component is generally characterized by the composite component that is in the majority. For example, a composite made from 20% by weight solid reinforcing elements and 80% by weight In is characterized as an In matrix composite.

The invention accordingly comprises the features that will be exemplified in the description hereafter set forth, and the scope of the invention will be indicated in the claims.

BRIEF DESCRIPTION OF THE DRAWINGS

For a fuller understanding of the nature of the invention, reference should be made to the following detailed description taken in connection with the accompanying drawings, in which.

DETAILED DESCRIPTION OF THE INVENTION

Figure 2:
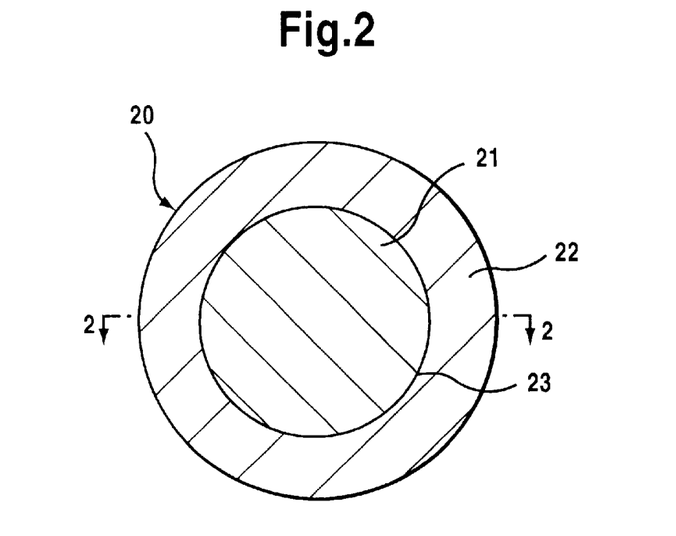
FIG. 2 is a cross-sectional view, taken along lines 2—2 thereof, of a non-segregating solid reinforcing element of the present invention.

Referring now to the drawings, in which like numerals refer to like elements thereof, FIG. 2, shows a cross-sectional view, taken along lines 2—2 of a non-segregating reinforcing element of the invention and is denoted as a whole by reference numeral 20. As shown in FIG. 2 the reinforcing element has an inner core material 21, surrounded by an outer shell material 22. An interface 23 is formed between the inner core material 21 and the outer shell material 22. As shown in the drawing, the reinforcing elements of the present invention are microcomposites themselves.

In a preferred embodiment of the present invention an improved composite is formed using solid reinforcing elements which are designed to have the same average density as a preselected liquid matrix, thereby minimizing or eliminating gravitational segregation. Since most common reinforcing elements have densities different from that of a matrix, reinforcing elements useful in the present invention are designed to have a multi-layered or microcomposite structure.

The solid reinforcing element 20 can be any spherical powder, rod, fiber, or cylinder. For example, the solid reinforcing spheres should ideally have a systematic, hexagonal or face-centered cubic arrangement. In addition, each powder should have the same number of neighboring powders, and should be spaced at the same distance from all its closest neighbors. Further, as is known in the art, it is impossible, during formation of particular reinforcing elements, to obtain absolute uniformity in the size, weight and density of the reinforcing elements. For example, spherical powder reinforcing elements are made up of a range of powders having different sizes, weights and densities, which are averaged to represent an average size, an average weight and an average density.

For illustration, a multi-layered reinforcing element in the form of a spherical powder is described. Specifically, the solid reinforcing spherical powder 20 has a inner spherical core material 21, having an average radius $r_1$, an average volume $v_1 = 4pr_1^3/3$, an average density $d_1$, and an average weight $w_1 = 4pd_1r_1^3/3$, where $p = pi = 3.142$. Further, the solid reinforcing spherical powder 20 has an outer solid shell material 22, having an average radius $r_2$, an average volume $v_2 = 4p(r_2^3 - r_1^3)/3$, an average density $d_2$, and an average weight $w_2 = 4p(d_2r_2^3 - d_2r_1^3)/3$, where $p = pi = 3.142$. The non-segregating principles and techniques described herein apply equally, with only obvious modifications, to other shapes of reinforcing elements.

Improved composites are formed when the solid reinforcing non-segregating spherical powders useful in the present invention are freely suspended in a liquid matrix of density $d_m$. Hence, the liquid composite matrix of volume $v_m$ must have a weight of $w_m$ which is:

$$w_m = (v_1 + v_2)d_m, w_m = 4p(r_1^3/3 + r_2^3/3 - r_1^3/3)d_m = w_{reinforcing\ sphere} = w_1 + w_2 = 4p[d_1r_1^3/3 + d_2(r_2^3 - r_1^3)/3]$$

Hence, $$r_2^3 d_m = r_1^3 d_1 + r_2^3 d_2 - r_1^3 d_2,\ r_1^3(d_2 - d_1) = r_2^3(d_2 - d_m),\ r_2/r_1 = \{(d_2 - d_1)/(d_2 - d_m)\}^{(1/3)}.$$

Table 1 is derived from the last equation. For example, in order to simplify the calculation, assume that $Al_2O_3$ is the solid core material with a density $d_1$ of 3.97, Bi is the solid shell material with a density $d_2$ of 9.75, and, that $r_1$ is equal to 1 unit such as 1 micron or 1 mil and the liquid composite matrix is made up of 50% by weight In and 50% by weight Sn and has a liquid density, $d_m$, of 7.0 gm/cc, according to the equation, $r_2 = \{(9.75 - 3.97)/(9.75 - 7.0)\}^{(1/3)} = 1.28$ micron or mil depending on the units.

As shown in Table 1, the reinforcing spheres are made of a rigid, temperature resistant inner core material 21, which may be any ceramic material including $Al_2O_3$, MgO, SiC, $SiO_2$, $TiO_2$, and $ZrO_2$ having densities of 3.97 gm/cc, 3.6 gm/cc, 3.16 gm/cc, 2.33 gm/cc, 4.23 gm/cc, and 5.7 gm/cc, respectively. Other inner core materials 21 are also useful in the present invention including: calcium oxide and carbon.

Outer shell materials 22 useful in the present invention include: Bi, Cd, Au, Fe, Pb, Mo, Ni, Ag, W, and Co, with densities of 9.75 gm/cc, 8.65 gm/cc, 19.3 gm/cc, 7.87 gm/cc, 11.4 gm/cc, 10.22 gm/cc, 8.90 gm/cc, 10.5 gm/cc, 19.3 gm/cc, and 8.90 gm/cc, respectively as shown in Table 1. The outer shell material 22 of the reinforcing elements have densities greater than that of the 7.0 gm/cc liquid composite matrix density, which compensates for the lighter ceramic inner core material.

Each of the inner core ceramic materials 21 of the solid reinforcing spheres given below has a lower density, $d_1$, than that of the liquid metallic matrix density of the composite, e.g., 7.0 gm/cc. The outer shell material 22 of the reinforcing elements has a density, $d_2$, which is higher than both the ceramic inner core material density, $d_1$, and the liquid matrix density, $d_m$ of the composite. If the inner core ceramic material 21 has a higher density, the outer shell material 22 must have a density lower than both the inner core material density, $d_1$, and the liquid matrix density, $d_m$ of the composite. In general, the outer shell material 22 must have a density $d_2$ which is extrapolated from the inner core material density $d_1$ through the liquid composite matrix density, $d_m$. Specifically, either $d_1 > d_m > d_2$ or $d_1 < d_m < d_2$.

TABLE 1

Multi-layered Spherical Reinforcing Powders $r_2/r_1$ Values

| Core Material 1: Density (gm/cc) | $Al_2O_3$ (3.97) | MgO (3.6) | SiC (3.16) | $SiO_2$ (2.33) | $TiO_2$ (4.23) | $ZrO_2$ (5.7) |
|---|---|---|---|---|---|---|
| Shell Material 2: Density (gm/cc) | | | | | | |
| Bi (9.75) | 1.28 | 1.31 | 1.34 | 1.67 | 1.40 | 1.09 |
| Cd (8.75) | 1.42 | 1.45 | 1.49 | 1.57 | 1.39 | 1.21 |
| Co (8.90) | 1.31 | 1.41 | 1.45 | 1.51 | 1.35 | 1.19 |
| Au (19.3) | 1.08 | 1.08 | 1.10 | 1.11 | 1.07 | 1.03 |
| Fe (7.87) | 1.65 | 1.70 | 1.76 | 1.85 | 1.61 | 1.36 |
| Pb (11.4) | 1.19 | 1.21 | 1.23 | 1.27 | 1.18 | 1.09 |
| Mo (10.22) | 1.25 | 1.27 | 1.30 | 1.35 | 1.23 | 1.12 |
| Ni (8.90) | 1.37 | 1.41 | 1.45 | 1.51 | 1.35 | 1.19 |
| Ag (10.5) | 1.23 | 1.25 | 1.28 | 1.33 | 1.22 | 1.11 |
| W (19.3) | 1.08 | 1.08 | 1.10 | 1.11 | 1.07 | 1.03 |

The liquid composite matrix of the composites of the present invention are, for illustrative purposes, made up of 50% by weight In and 50% by weight Sn and have a liquid density, $d_m$, of about 7.0 gm/cc. It is, desirable to select the composition of the composite matrix alloy so that its component metals have their densities points within 10–20%, or even 5%, of each other, or one another at the composite processing temperature. Other pairs or groups of metals with very close densities (at the melting point given in parentheses) include: Al (2.38 gm/cc)-Si (2.57 gm/cc), Mn (5.95 gm/cc)-Ga (6.08 gm/cc)-Zn (6.21 gm/cc)-Cr (6.3 gm/cc), Co (7.75 gm/cc)-Ni (7.80 gm/cc)-Cd (8.0 gm/cc)-Cu (8.02 gm/cc), Ag (9.32 gm/cc)-Mo (9.33 gm/cc), and Bi (10.05 gm/cc)-Pb (10.66 gm/cc).

The selection of In-Sn alloy as the composite matrix has a desired effect. Because the density of liquid In at its melting point is 7.02 gm/cc, while that of the liquid Sn at its melting point is 6.99 gm/cc. The difference in liquid densities is only 0.03 gm/cc or 0.43% at a temperature between the two melting points. The density of this liquid and solid matrix alloy thus remains substantially constant at about 7.0 gm/cc even with minor variations in the liquid or solid matrix alloy composition (±10–20% by weight In) or even major variations in the liquid or solid matrix alloy composition (from 0 to 100 weight % In) due to, e.g., material preparation errors and freezing segregations.

The radius of the inner core material 21 depends on the thickness of the composite, but should generally be less than 200 microns. For example, 20 micron spheres having an $Al_2O_3$ inner core material 21 and a radius of $r_1 = 10$ microns should be coated with a thickness $(r_2 - r_1)$ of 2.8 microns of outer shell or surface coating material 22 of Bi with a $r_2 = 12.8$ microns. The outer shell, of the present invention, has a thickness of from 1 micron to 1 mm. Such solid spherical reinforcing powders will be freely and uniformly distributed in a liquid composite matrix alloy of 50% by weight In-50% by weight Sn and having a liquid density of about 7.0 gm/cc.

One major difficulty with ceramics is that it is very difficult to obtain voidless bonds when they are coated with any coating material including metals and ceramics. However, U.S. Pat. Nos. 5,392,982 and 5,230,924, to Li, which are incorporated herein by reference, disclose bonding methods which overcome various ceramic bonding problems. Hence, a coating or outer shell metal material 22 on a solid reinforcing element's inner core 21 can be selectively and voidlessly bonded to both the solid core ceramic material 21 and to the composite matrix, to achieve efficient load transfer within each reinforcing element, between neighboring reinforcing elements, and to and from the reinforcing elements relative to the solid composite matrix. Further, a metallized layer on the ceramic inner core material 21 can form a reliable prime coat onto which other metal layers may be added, if needed. These subsequent metal layers are much more easily applied, i.e., wetted to and bonded onto this properly metallized layer on the ceramic inner core, than to the ceramic core itself, thereby improving processing reliability and composite product qualities. This is because metal-metal bonding science is better understood than ceramic-metal bonding. The liquid composite matrix can be considered as such an other metal layer.

The subsequent metal layers may include diffusion barriers formed of refractory metals such as W, Mo, Cr, Pt, and other precious metals such as Pd, Os, Re, and the like. Further, less expensive metals such as Pb, Cu, and Fe may be used to build up the required weight of the solid reinforcing elements. In addition, protective and temperature-resistant surface layers such as Au, Pt, Al, Cr, Au, and Pt which minimize surface oxidation may be used.

Solid spherical reinforcing powders each containing a solid inner core material and one or more outer shell or surface coating materials in different concentric layers can also be designed and used with equally satisfying results in the present invention. Similar design tables for elongated reinforcing fibers or rods, sheets, weaves, or a combination of these different shapes can also be developed. Various density data is available in CRC Handbook of Chemistry and Physics, D. R. Lide, Ed. in Chief, CRC Press, NY, 1996 which is incorporated herein by reference.

Figure 4:
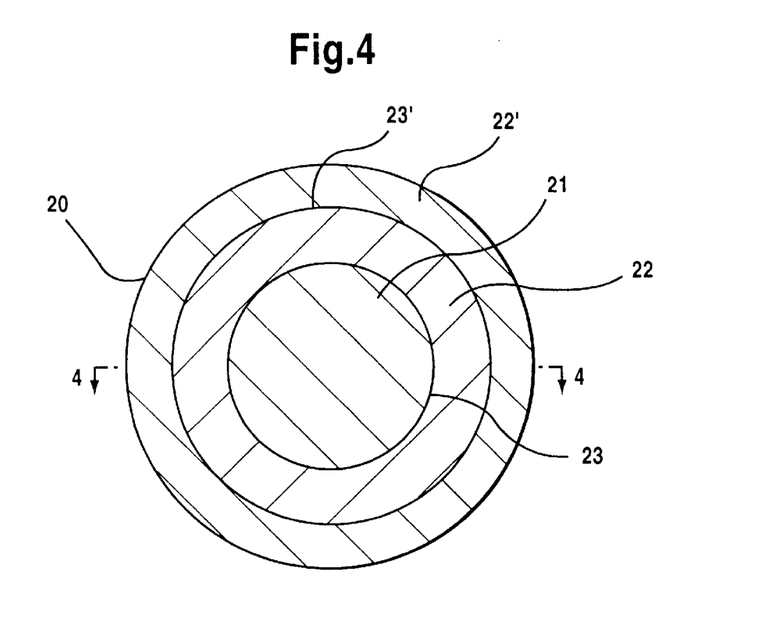
FIG. 4 is a cross-sectional view, taken along lines 4—4 thereof, of a further embodiment of a non-segregating solid reinforcing element of the present invention.

FIG. 4, shows a cross-sectional view, taken along lines 4—4 of a further embodiment of a non-segregating reinforcing element of the invention and is denoted as a whole by reference numeral 20. As shown in FIG. 4 the reinforcing element has an inner core material 21, surrounded by an outer shell material 22. An interface 23 is formed between the inner core material 21 and the outer shell material 22. An additional outer shell material 22' surrounds the outer shell material 22. An interface 23' is formed between the outer shell materials 22 and 22'.

Materials other than the above ceramics, including metals or metal compounds, are also useful is the present invention as the inner core material 21 of the solid reinforcing elements. In many cases, ceramics can also be used as the outer shell or surface coating material 22. Ceramics are particularly useful because of their refractory properties, hardness, and their ability to function as diffusion barriers.

Those skilled the art are aware that certain modifications may be necessary due, for example, to the lack of or inaccuracy of available density data. Specifically, the CRC Handbook provides density values for laboratory pure metals, not practical metals containing impurities. In has a density of 7.02 gm/cc at its melting point of 156.6° C., while Sn has a density of 6.99 gm/cc at its melting point of 231.9° C. Hence, the 50% by weight In-50% by weight Sn melted alloy for the composite matrix at the composite processing temperature is considered to have a liquid density of about 7.00 gm/cc. Further, the densities of the outer shell or surface coating materials 22, such as Bi, Cd, Co, Au, Fe, Pb, Mo, Ni, Ag, and W are given in the Handbook, but only at 20° C. and not at the actual composite processing temperature.

However, composites designed according to the above parameters give substantially uniform distribution of the suspended solid reinforcing spheres in the liquid 50% by weight In-50% by weight Sn composite matrix. For still better distribution results, the skilled person can perform a few simple tests to determine specific $r_2/r_1$ values. In addition, when more precise and comprehensive density data for impure metals at various composite processing temperatures becomes available, the skilled person can even replace the estimated density values used in the above table with the exact values by a revised calculation using the improved density data according to the formula given above.

Other factors which may require consideration by the skilled artisan in practicing the present invention include the interaction and interdiffusion between the different materials, new phase formations with their associated volume and density changes, and solidification effects due to, e.g., freezing solute segregations according to the phase diagram, and other temperature effects including those due to solute segregation arising from freezing temperature gradients. Yet another factor to consider is that the liquid composite matrix, is an alloy rather than a pure metal and is therefore continuously undergoing freezing, solute segregation, and density changes, according to its phase diagram. Further, liquid density generally decreases with increasing temperature and a decreased heavier alloy component content.

Eutectic alloys are particularly useful in the present invention. Each eutectic alloy has the lowest melting point for the entire alloy system, lowering the alloy freezing and composite processing temperature. The eutectic freezes at its singular melting point, not in a freezing range of temperatures as for non-eutectic alloys. Further, during freezing, non-eutectic alloys continuously change temperatures, compositions, and densities. In contrast, the eutectic alloy always freezes out at one singular composition (i.e., eutectic composition) at the singular eutectic temperature with, therefore, one singular liquid density. These features eliminate or minimize changes in the liquid composite density due to variations in freezing temperatures and alloy compositions, freezing solute segregations according to the phase diagram, and freezing temperature gradients leading to composition and density gradients. A composite matrix alloy having a eutectic composition or nearly eutectic composition will, therefore, greatly simplify the control of the matrix density and, therefore, the distribution of the solid reinforcing elements therein.

Figure 3:
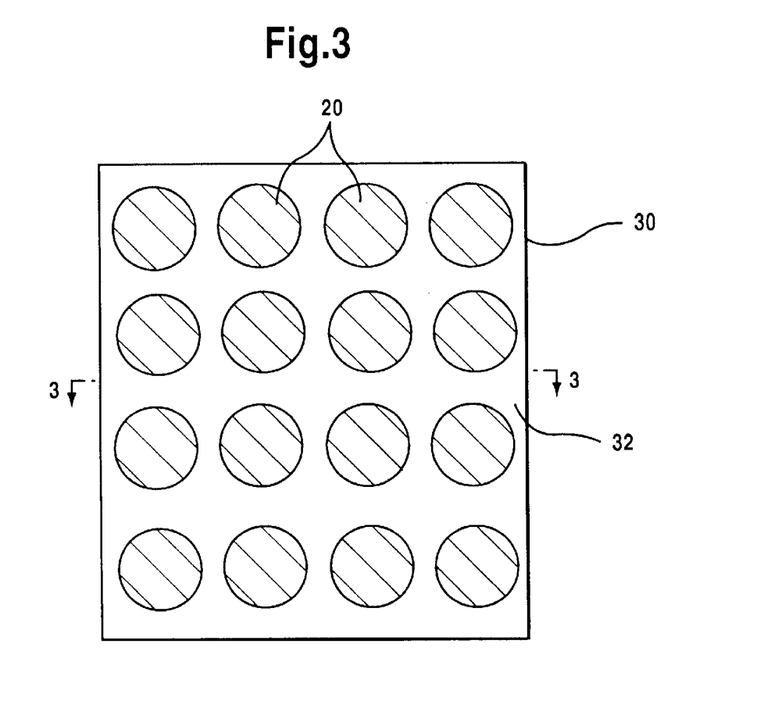
FIG. 3 is a cross-sectional view, taken along lines 3—3 thereof, of an improved reinforced composite which is reinforced with a plurality of non-segregating reinforcing elements of the present invention.
Figure 5:
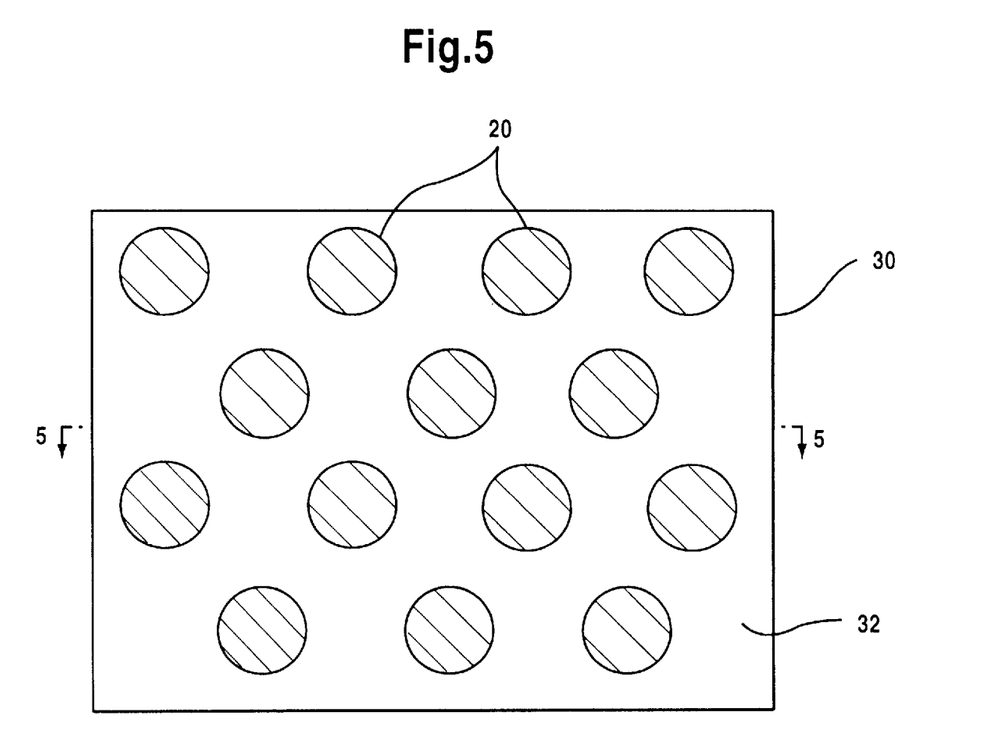
FIG. 5 is a cross-sectional view, taken along lines 5—5 thereof, of a further embodiment of an improved reinforced composite which is reinforced with a plurality of non-segregating reinforcing elements of the present invention.

The uniform distribution of reinforcing elements which is achieved in accordance with the present invention is shown in FIGS. 3 and 5, which are cross-sectional views of inventive reinforced composites, taken along lines 3—3 and 5—5 thereof, respectively and are denoted as a whole by reference numeral 30. As shown in FIGS. 3 and 5 the inventive reinforcing elements 20 have a uniform distribution in the composite matrix 32.

The present invention minimizes interdiffusion and interaction among different component materials by using surface layers of inert or high-temperature diffusion barriers of W, Mo, Cr, Ti, or even of ceramics such as those given as the core materials 21 listed above. Further, differing composite shape, size, and depth/width ratio (or aspect ratio) affects the temperature profile or gradient during freezing, local accumulation of the settling solid reinforcing elements, or depletion of liquid composite matrix metal, and their associated changes in alloy freezing behavior. Again, the eutectic matrix alloy with equal density matrix components described above is very useful to achieve substantially uniform distribution of the solid reinforcing elements both in the initial liquid suspension, and in the subsequently solidified composite matrix.

Modifications to the composite structure and the solid reinforcing element design described fall within the scope of the instant invention. For example, the surface layer or layers may uniformly cover the entire outer surface of the solid reinforcing elements, or a heavier metal may be partially coated onto only one side of the solid reinforcing element. In a liquid composite matrix, this partially coated solid reinforcing element will automatically orient itself to locate the heavier, metal coated side at the bottom thereby achieving oriented and aligned solid reinforcing elements in the composite matrix.

In addition, the ceramic core of the solid reinforcing element may be surface coated by spraying, dipping, or fluidizing with the usual W-Fe and Mo-Mn ceramic metallizing compositions, to be further heated to 1200° C. for the required fusion ceramic metallized layers for forming the necessary prime coating on the ceramic-cored solid reinforcing element. Further, the shape of solid reinforcing elements is not necessarily limited to simple shapes such as spheres, cylinders, sheets, or weaves. Tiny structures with complicated shapes may be desirable in many cases.

It will thus be seen the objects set forth above, and those made apparent from the foregoing description, are efficiently attained and since certain changes may be made in the foregoing description without departing from the scope of the invention, it is intended that all matters contained in the foregoing description or shown in the accompanying drawings shall be interpreted as illustrative and not in a limiting sense.

While the illustrated embodiments given in this specification employ certain forms of composite design and processing procedures, other embodiments may employ other composite designs to be achieved with other processing procedures. Still other alternatives in the composite designs and procedures are possible. Some techniques are provided for the alternative approaches toward filling the objects of the invention.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A method of making an improved solid-reinforced composite comprising:

mixing a liquid composite matrix having a preselected liquid density $d_m$ and a plurality of solid reinforcing elements to provide a mixture, each of said solid reinforcing elements having an inner core material and an outer shell material thereon, said inner core material having a preselected average radius or half-thickness $r_1$, a preselected average volume $v_1$, a preselected average density $d_1$, and a preselected average weight $w_1$, said outer shell material having a preselected average radius or half-thickness $r_2$, a preselected average volume $v_2$, a preselected average density $d_2$, and a preselected average weight $w_2$, wherein each of said reinforcing elements including said core material and said shell material thereon has an average solid density substantially equal to said preselected liquid density of said liquid composite matrix to thereby stably and substantially uniformly distribute said solid reinforcing elements in said liquid composite matrix for forming an improved solid-reinforced composite in a liquid form.

2. The method of claim 1 wherein said plurality of solid reinforcing elements is selected from the group consisting of a powder, a fiber, a rod, a sheet, a weave, a tiny structure with a complicated shape, and combinations thereof.

3. The method of claim 1 wherein said liquid composite matrix is a metal alloy having a plurality of metal components with melting points within 10% of each other or one another, thereby facilitating control of said preselected liquid density of said liquid composite matrix.

4. The method of claim 1 wherein said liquid composite matrix is an eutectic material, thereby allowing the composite processing to be carried out at a low temperature.

5. The method of claim 2 wherein at least a plurality of said solid reinforcing elements comprise ceramics selected from the group consisting of alumina, magnesia, silica, zirconia, calcium oxide, titanium dioxide, carbon, graphite, diamond, silicon carbide, other select metal compounds and combination thereof.

6. The method of claim 1 wherein said solid reinforcing elements have a common radius or half-thickness of no more than 3 mils.

7. The method of claim 1 wherein the outer shell material has a maximum density of 19.3 grams per cubic centimeter and the inner core material of at least a plurality of said solid reinforcing elements has a common radius or half-thickness of less than 200 microns.

8. The method of claim 1 wherein the average $r_1$ and $r_2$ are derived from the equation $r_2/r_1=\{(d_2-d_1)/(d_2-d_m)\}^{(1/3)}$.

9. A method of making an improved solid-reinforced composite comprising:

mixing a liquid composite matrix having a preselected liquid density and a plurality of solid reinforcing elements to produce a mixture;

each of said solid reinforcing elements having an inner core material and an outer shell material thereon;

said inner core material having a preselected average radius or half-thickness $r_1$, a preselected average volume $v_1$, a preselected average density $d_1$, an a preselected average weight $w_1$;

said outer shell material having a preselected average radius or half-thickness $r_2$, a preselected average volume $v_2$, a preselected average density $d_2$, and a preselected average weight $w_2$, wherein each of said reinforcing elements including said core material and said shell material thereon has an average solid density substantially equal to said preselected liquid density of said liquid composite matrix to thereby substantially stably and uniformly distribute said solid reinforcing elements in said liquid composite matrix for forming an improved solid-reinforced composite in a liquid form.

10. The method of claim 9 wherein said plurality of solid reinforcing elements is selected from the group consisting of a powder, a fiber, a rod, a sheet, a weave, a tiny structure with a complicated shape, and combinations thereof.

11. The method according to claim 9 wherein said liquid composite matrix is a metal alloy having a plurality of metal components with melting points within 10% of each other or one another, thereby facilitating control of said preselected liquid density of said liquid composite matrix.

12. The method of claim 9 wherein said preselected liquid composite matrix is an eutectic material, thereby allowing the composite processing to be carried out at a low temperature.

13. The method of claim 9 wherein at least a plurality of said solid reinforcing elements comprise ceramics selected from the group consisting of alumina, magnesia, silica, zirconia, calcium oxide, titanium dioxide, carbon, graphite, diamond, silicon carbide, other selected metal compounds and combination thereof.

14. The method of claim 9 wherein at least a plurality of said solid reinforcing elements have a common radius or half-thickness of no more than 3 mils.

15. The method of claim 9 wherein the outer shell material has a maximum density of 19.3 grams per cubic centimeter and the inner core material of a plurality of said solid reinforcing elements has a common radius or half-thickness of less than 200 microns.

16. An improved composite containing solid reinforcing elements for substantially stably uniform and gravitationally non-segregating distribution in a liquid composite matrix, comprising:

a liquid composite matrix having a preselected liquid density $d_m$ and suspended therein a plurality of said solid reinforcing elements;

each of said solid reinforcing elements having an inner core material and an outer shell material thereon;

said inner core material having a preselected average radius or half-thickness $r_1$, a preselected average volume $v_1$, a preselected average density $d_1$, and a preselected average weight $w_1$;

said outer shell material having a preselected average radius or half-thickness $r_2$, a preselected average volume $v_2$, a preselected average density $d_2$, an a preselected average weight $w_2$, wherein each of said reinforcing elements has an average solid density substantially equal to said preselected liquid density of said liquid composite matrix thereby achieving substantially uniform and stable distribution of said solid reinforcing elements in said liquid composite matrix to thereby form an improved solid-reinforced composite in a liquid suspension form;

said solid-reinforcing elements having substantially no tendency to sink down or float up in said liquid composite matrix during a suspension period in its entity.

17. Solid reinforcing elements for substantially uniform and gravitationally non-segregating distribution in a liquid composite matrix to thereby form a stable suspension mixture without substantially any tendency to sink down or float up in said liquid composite matrix during a suspension period in its entity, comprising on each one thereof:

an inner solid core material and an outer solid shell material thereon;

said inner core material having a preselected average radius or half-thickness $r_1$, a preselected average volume $v_1$, a preselected average density $d_1$, and a preselected average weight $w_1$;

said outer shell material having a preselected average radius or half-thickness $r_2$, a preselected average volume $v_2$, a preselected average density $d_2$, and a preselected average weight $w_2$, wherein each of said reinforcing elements has an average solid density substantial equal to a preselected liquid density of said liquid composite matrix thereby achieving a solid-reinforced liquid composite which has a substantially uniform and stable distribution of said solid reinforcing elements in said liquid composite matrix.

18. The solid reinforcing elements of claim 17 wherein in each of said solid reinforcing elements said outer shell material comprises a metallic layer having a density substantially different from that of said inner core material of said respective solid reinforcing elements; said metallic layer having a coverage pattern on said reinforcing elements which is selected from the group consisting of uniform coverage of a respective outer surface of each of said respective solid reinforcing elements substantially in its entirety, and partial coverage on said respective select outer surface portions on said respective solid reinforcing elements whereby said reinforcing elements automatically orient or position the respective heavier or lighter, partially metal-covered select outer surface portions in a common vertical direction when suspended in said liquid composite matrix or when embedded in a solidified liquid composite matrix thereby achieving oriented solid reinforcing elements in said composite.

19. The solid reinforcing elements of claim 17 wherein each of at least a plurality of said solid reinforcing elements has a radius or half-thickness of no more than 3 mils.

20. The solid reinforcing elements of claim 17 wherein said outer shell material has a maximum density of 19.3 grams per cubic centimeter and the inner core material of each of a plurality of said solid reinforcing elements has a common radius of half-thickness of no more than 3 mils.

21. The solid reinforcing elements of claim 17 wherein each of said reinforcing elements is a ceramic and the outer shell material comprises a fusion-metallized, fusion-bonded layer which is free of voids visible at magnification of up to 1000 times thereby achieving enhanced reinforcing properties of said solid reinforcing elements.

22. The solid reinforcing elements of claim 17 wherein each of said solid reinforcing elements is a ceramic selected from the group consisting of alumina, magnesia, silica, zirconia, calcium oxide, titanium dioxide, carbon, diamond, graphite, metal compounds, silicon carbide, and combinations thereof.

23. The method according to claim 1 further comprising:
solidifying said liquid composite matrix mixture under a condition sufficient to achieve a substantially stable and uniform distribution of said solid reinforcing element in said liquid composite matrix mixture to thereby form said improved solid-reinforced composite in a solid form.

24. The method according to claim 9 further comprising:
freezing said liquid composite matrix mixture under a condition sufficient to achieve a substantially stable and uniform distribution of said solid reinforcing element in said liquid composite matrix mixture to thereby form said improved solid-reinforced composite in a solid form.

25. The method according to claim 1 wherein $w_1+w_2=(v_1+v_2)d_m$.

26. The method according to claim 1 wherein:
said solid reinforcing elements are generally spherical powders or cylindrical fibers; said inner core material has a preselected average radius or half-thickness $r_1$; said shell material has a preselected average outer shell material has a preselected average radius or half-thickness $r_2$; wherein each of said reinforcing elements including said core material of said preselected average weight $w_1$ and said shell material of said preselected average weight $w_2$ has said average solid density substantially equal to said preselected liquid density of said liquid composite matrix to thereby form said improved solid-reinforced composite.

27. The improved reinforced composite according to claim 16 further comprising:
solidifying said liquid composite mixture under a condition sufficient to achieve a substantially uniform distribution of said solid reinforcing elements in said liquid composite matrix mixture to thereby form said improved solid-reinforced composite in a solid form.

28. An improved liquid composite matrix for suspending or embedding therein solid reinforcing elements in a substantially gravitationally non-segregated manner for use in forming a solid-reinforced composite wherein said solid reinforcing elements are substantially stably and uniformly distributed or embedded; comprising:

a plurality of solid reinforcing elements having a preselected, substantially constant average density;

a plurality of metal components in a preselected weight proportion;

said metal components being capable of forming a liquid metal alloy for use as a liquid composite matrix alloy for the suspension therein of said reinforcing elements;

said preselected weight proportion being so chosen that said liquid composite matrix alloy has an average matrix alloy density which is at least nearly the same as that of said preselected average density of said reinforcing elements so that said reinforcing elements are substantially and stably non-segregating gravitationally in said liquid composite matrix alloy to thereby form said solid-reinforced composite with said reinforcing elements suspended therein in a substantially uniformly, stable distributed pattern with no tendency to sink down or float up due to gravity throughout an entire suspension period of said reinforcing elements in said liquid composite matrix alloy.

29. The improved liquid composite matrix according to claim 28 wherein said metal components have their respective densities which are within 10% of each other or one another.

30. A method of making an improved liquid composite matrix for suspending therein a plurality of solid reinforcing elements of a preselected average density to form a solid-reinforced composite wherein each of said reinforcing elements has a preselected, substantially constant average density, comprising:

supplying a plurality of liquid components in a preselected weight proportion;

forming with said supplied liquid components in said preselected weight proportion a liquid composite matrix mixture of an average liquid density for the suspension therein of said reinforcing elements;

selecting said preselected weight proportion such that said liquid density of said liquid composite matrix mixture is at least nearly the same as that of said preselected average density of said reinforcing elements so that said reinforcing elements are substantially stably non-segregating in said liquid composite matrix mixture, to thereby form said said solid-reinforced liquid composite with said reinforcing elements suspended therein in a substantially stably and uniformly distributed pattern.

31. The method according to claim 30 wherein said liquid components in said liquid composite matrix alloy have their respective densities which are sufficiently close to each other or one another so that any deviation from said preselected weight proportion does not significantly change said average liquid density of said liquid composite matrix alloy thereby maintaining substantially constant said substantially stable and uniform distribution stably and uniformly distributed pattern.

32. A method according to claim 30 wherein said liquid components have respective densities which are within 10% of each other or one another.

33. A method of making stably non-segregating solid reinforcing elements for suspension in a select liquid composite matrix of a preselected liquid density $d_m$ to thereby form a stably non-segregating solid-reinforced composite, comprising:

supplying for each of said solid reinforcing elements a respective solid inner core material of a selected shape and having a preselected average radius or half-thickness $r_1$, a preselected average volume $v_1$, a preselected average density $d_1$, and a preselected average weight $w_1$;

providing on said respective inner core material a solid outer shell material having a preselected average radius or half-thickness $r_2$, a preselected average volume $v_2$, a preselected average density $d_2$, and a preselected average weight $w_2$; and adjusting the values of $v_2$ and $v_1$, so that each of said reinforcing elements has an average weight of $v_1 d_1 + v_2 d_2$ which is substantially equal in weight to that of a volume of $v_1 + v_2$ of said liquid composite matrix having said preselected liquid density $d_m$ to thereby achieve a substantially stably non-segregating quality of said solid reinforcing elements when suspended in said liquid composite matrix thereby forming a stable solid-reinforced composite in a liquid form.

34. The method according to claim 33 further comprising:

solidifying said liquid composite matrix suspension containing said substantially stably non-segregating solid reinforcing elements therein under a condition sufficient to achieve a substantially and stably non-segregating quality of said solid reinforcing elements in said solidified solid-reinforced composite.

35. The method of claim 1 wherein said liquid composite matrix is a liquid composite having a plurality of liquid components with melting points sufficiently close to each other or one another to significantly facilitate control of said preselected liquid density of said liquid composite matrix.

36. The method of claim 9 wherein said liquid composite matrix is a liquid composite having a plurality of liquid components with melting points sufficiently close to each other or one another to significantly facilitate control of said preselected liquid density of said liquid composite matrix.

37. The liquid composite matrix of claim 28 which has a plurality of metal components with melting points sufficiently close to each other or one another to significantly facilitate control of said average matrix alloy density of said liquid composite matrix alloy whereby said reinforcing elements become gravitationally non-segregating when suspended in said liquid composite matrix alloy, with substantially no tendency to sink down or float up in said liquid composite matrix alloy.

38. The method according to claim 33 wherein at least a selected portion of an outer surface of said outer shell material consists essentially of a metal which is more easily wetted to the liquid composite matrix and bonded onto the solidified composite matrix, than the solid outer shell material without said metal thereby improving processing reproducibility and composite product qualities.

39. The method according to claim 33 wherein at least a selected portion of an outer surface of said outer shell material comprises a diffusion barrier material to suppress unwanted diffusion of metal.

40. A method of making an improved solid-reinforced composite comprising:

providing a liquid composite matrix and a plurality of solid reinforcing elements;

said reinforcing elements being substantially gravitationally non-segregating when suspended in said liquid composite matrix;

mixing said liquid composite matrix with said plurality of solid reinforcing elements to produce a liquid, substantially stable non-segregated composite suspension mixture in which said solid reinforcing elements do not substantially sink or float under the influence of gravity; and converting said liquid substantially stable non-segregated composite suspension mixture, via a liquid-to-solid phase change, to a solid-reinforced composite which contains the solid reinforcing elements substantially stably and uniformly distributed and embedded in the solid composite.

41. The method as in claim 40 wherein said converting step comprises a process selected from the group consisting of a solidification and polymerization.

42. The method as in claim 40 wherein said liquid composite matrix is a polymerizable plastic material and said converting step comprises a polymerization process of the liquid plastic matrix.

43. The method as in claim 40 including selecting said liquid composite matrix to have a matrix composition in a selected material system;

said material system having a freezing range with a lowest freezing temperature at a fixed chemical composition and density of said liquid composite matrix; and freezing said matrix composition at said fixed chemical composition and density with said solid reinforcing elements suspended therein thereby simplifying control of composition and density of said liquid composite matrix and distribution and embedding of said solid reinforcing elements in a solid composite matrix.

44. The method as in claim 40 including selecting said liquid composite matrix to be a eutectic in which eutectic material components have approximately equal densities to simplify control of distribution of the solid reinforcing elements both initially in the liquid, non-segregated composite mixture and finally in the solidified composite matrix.

45. The method of making an improved solid-reinforced composite comprising:

providing a liquid composite matrix having a preselected matrix density and a plurality of solid reinforcing elements having a substantially constant preselected reinforcement density;

said matrix and reinforcement densities being significantly different from each other so that when suspended in said liquid composite matrix, said reinforcing elements gravitationally segregate by sinking of floating therein; and:

modifying with a density-modifying material at least one of said liquid composite matrix and said solid reinforcing elements to produce at least one new, density-modified material having an average new modified density such that the new modified density and the unmodified density, or the two new modified densities, are substantially the same thereby minimizing gravitational segregation of the solid reinforcing elements in the liquid composite matrix.

46. The method as in claim 45 wherein said modifying step comprises at least a physical or chemical combination of said density-modifying material with at least one of said liquid composite matrix and said unmodified solid reinforcing elements.

47. The method as in claim 45 including providing said solid-reinforced composite in a layer form no more than 3 mils thick.

48. The method as in claim 40 including:

supplying a casting mold; and introducing said liquid, substantially stable non-segregated composite mixture into said casting mold; and converting the liquid suspension mixture through a liquid-to-solid conversion process to provide a solidified, cast product of a reinforced composite containing said solid reinforcing elements substantially stably and uniformly embedded therein.

49. The method as in claim 46 wherein:

said liquid composite matrix has a preselected matrix density; and each of said non-segregating reinforcing elements has a solid core material having a core material density, and an outer shell material having a shell material density;

said shell material density being extrapolated from said core material density through an intermediate preselected liquid composite matrix density.

50. The method as in claim 49 including voidlessly bonding said shell material to both said core material and said liquid composite matrix material in its solid form.

51. The method as in claim 49 wherein said shell material comprises a plurality of different solid material layers sequentially applied onto an outer surface thereof.

52. The method as in claim 49 wherein each of said reinforcing elements is a ceramic and said outer shell material comprises a fusion-metallized, fusion-bonded layer which is free of voids visible at magnification of up to 1000 times thereby achieving enhanced reinforcing properties of said solid reinforcing elements.

53. The method as in claim 40 wherein said providing step comprises providing a plurality of solid reinforcing elements all having substantially a single size and geometry, a single average chemical composition, and a single density;

said reinforcing elements interacting with each other or one another only mechanically through an intervening composite matrix; without any chemical interactions therebetween, with the composite matrix, and with any material coming into contact during the composite making process, to form any new chemical compounds having different average compositions and densities;

there being no significant chemical or geometrical changes of said reinforcing elements, no significant settling of reinforcing elements in said composite matrix, and no significant loss of said liquid composite matrix during said composite making process.

54. The method as in claim 16 wherein said providing step comprises providing a plurality of solid reinforcing elements all having substantially a single size and geometry, a single average chemical composition, and a single density;

said reinforcing elements interacting with each other or one another only mechanically through an intervening composite matrix; without any chemical interactions therebetween, with the composite matrix, and with any material coming into contact during the composite making process, to form any new chemical compounds having different average compositions and densities;

there being no significant chemical or geometrical changes of said reinforcing elements, no significant settling of reinforcing elements in said composite matrix, and no significant loss of said liquid composite matrix during said composite making process.

55. The method as in claim 17 wherein said providing step comprises providing a plurality of solid reinforcing elements all having substantially a single size and geometry, a single average chemical composition, and a single density;

said reinforcing elements interacting with each other or one another only mechanically through an intervening composite matrix; without any chemical interactions therebetween, with the composite matrix, and with any material coming into their contact during the composite making process, to form any new chemical compounds having different average compositions and densities;

there being no significant chemical or geometrical changes of said reinforcing elements, no significant settling of reinforcing elements in said liquid composite matrix, and no significant loss of said liquid composite matrix during said composite making process.

56. The method according to claim 40 wherein at least a plurality of solid reinforcing elements comprise on an outer surface thereof a surface material layer of up to 1 mm thick and having a density of up to 19.3 g/cc;

said outer surface material layer having a thickness of up to 76% of a radius or half thickness of said solid reinforcing elements.

57. The method according to claim 56 wherein at least a plurality of solid reinforcing elements have respective ceramic cores therein, each ceramic core having a respective metallized outer surface material layer bonded thereto.

58. The method of claim 40 wherein said solid reinforcing elements are preferentially oriented in a selected direction thereby achieving oriented reinforcing elements in the solid-reinforced composite.

\* \* \* \* \*